(12) United States Patent
Kamada

(10) Patent No.: US 9,129,833 B2
(45) Date of Patent: Sep. 8, 2015

(54) LIGHTING DEVICE, DISPLAY DEVICE AND TELEVISION DEVICE

(75) Inventor: Kentaro Kamada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 385 days.

(21) Appl. No.: 13/695,853

(22) PCT Filed: Apr. 15, 2011

(86) PCT No.: PCT/JP2011/059360
§ 371 (c)(1),
(2), (4) Date: Nov. 2, 2012

(87) PCT Pub. No.: WO2011/152134
PCT Pub. Date: Dec. 8, 2011

(65) Prior Publication Data
US 2013/0050589 A1 Feb. 28, 2013

(30) Foreign Application Priority Data
Jun. 2, 2010 (JP) ................................. 2010-126950

(51) Int. Cl.
*H01L 33/60* (2010.01)
*H01L 25/075* (2006.01)
*G02F 1/1335* (2006.01)

(52) U.S. Cl.
CPC ...... *H01L 25/0753* (2013.01); *G02F 1/133605* (2013.01); *G02F 1/133603* (2013.01); *H01L 33/60* (2013.01)

(58) Field of Classification Search
CPC .......................... G02F 1/133605; H01L 33/60
USPC .................................. 362/97.2, 555, 511, 97.3
See application file for complete search history.

(56) References Cited

U.S. PATENT DOCUMENTS

| 7,697,087 B2 * | 4/2010 | Chang ............................. 349/61 |
| 8,104,909 B2 * | 1/2012 | Shin ............................. 362/97.1 |
| 2006/0180824 A1 * | 8/2006 | Kim et al. ....................... 257/99 |
| 2007/0064171 A1 | 3/2007 | Moriyasu et al. |
| 2009/0154140 A1 | 6/2009 | Aoki et al. |

FOREIGN PATENT DOCUMENTS

| JP | 2007-080798 A | 3/2007 |
| JP | 2010-015853 A | 1/2010 |
| WO | 2006/059411 A1 | 6/2006 |

OTHER PUBLICATIONS

Official Communication issued in International Patent Application No. PCT/JP2011/059360, mailed on Jul. 19, 2011.

* cited by examiner

*Primary Examiner* — Sharon Payne
(74) *Attorney, Agent, or Firm* — Keating & Bennett, LLP

(57) ABSTRACT

A technology to suppress or prevent an uplift of a reflection sheet included in a direct type lighting unit is provided. A direct type backlight unit according to the present invention includes an LED board 30, an LED 28 arranged on a surface of the LED board 30, a reflection sheet 26 arranged on the surface of the LED board 30. The reflection sheet 26 has a through hole 27 through which the LED 28 is passed. The reflection sheet 26 is arranged such that a part 26a of a periphery 27a of the through hole 27 is located between a light emitting surface 28a of the LED 28 and the LED board 30.

14 Claims, 8 Drawing Sheets

FIG.1
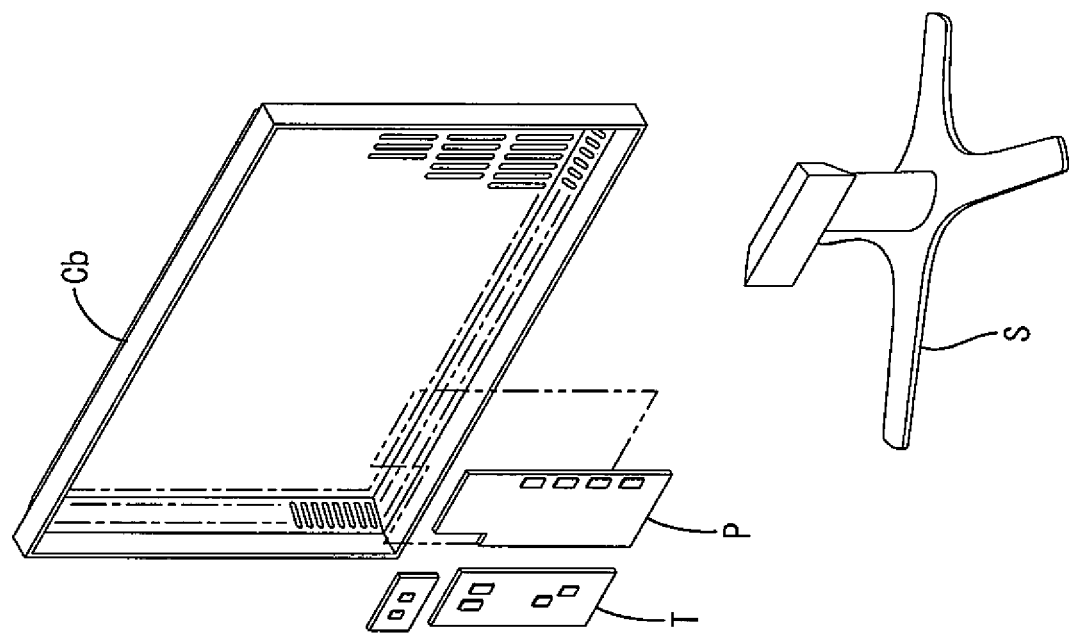
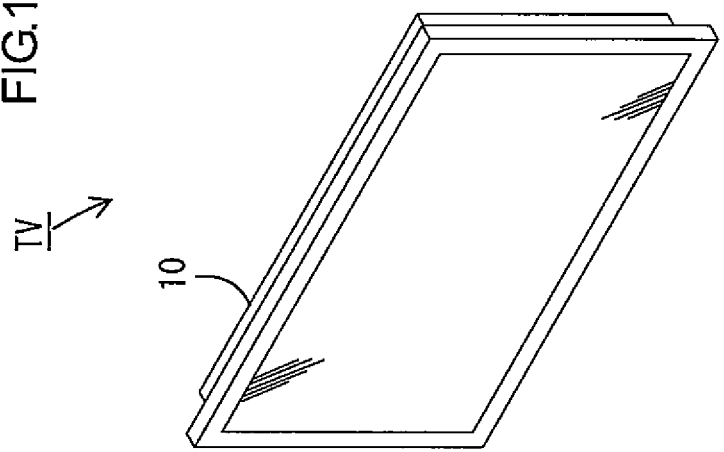
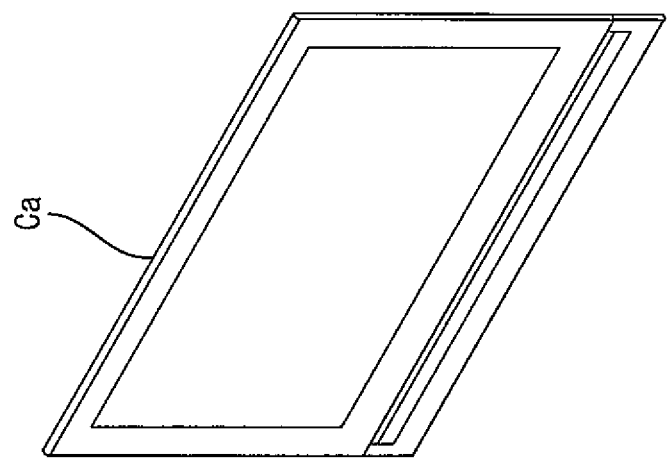

LIGHTING DEVICE, DISPLAY DEVICE AND TELEVISION DEVICE

TECHNICAL FIELD

The present invention relates to a lighting device, a display device and a television device.

BACKGROUND ART

In recent years, a display element of an image display device such as a television receiver is shifting from a conventional CRT display device to a thin display device using a thin display element such as a liquid crystal panel and a plasma display panel. This enables the image display device to have a reduced thickness. A liquid crystal panel used for a liquid crystal display device does not emit light, and thus a backlight unit is required as a separate lighting device.

As the backlight unit, a direct type backlight unit that supplies light directly to a liquid crystal panel from the rear side of the liquid crystal panel is known. In such a backlight unit, a reflection sheet may be provided on a light source board on which light sources such as LEDs are arranged.

Patent Document 1 discloses a direct type backlight unit including the reflection sheet provided on the light source board on which LEDs are arranged. The backlight unit includes LEDs, an LED board on which the LEDs are arranged, a diffuser plate arranged to face light emitting surfaces of the LEDs, spacers arranged on the LED board, and a reflection sheet arranged on the LED board. The reflection sheet has a plurality of through holes through which the light sources and the spacers are passed. In this backlight unit, the spacers maintain a predetermined distance between the LED board and the diffuser plate, and thus uneven brightness of a display surface of the backlight unit can be prevented or suppressed.

Patent Document 1: Japanese Unexamined Patent Publication No. 2010-15853

Problem to be Solved by the Invention

In the backlight unit described in Patent Document 1, a part of the reflection sheet may be uplifted due to heat generated near the LEDs or due to displacement of the reflection sheet. In such a case, the light emitted from the LEDs may be blocked by the reflection sheet. This may deteriorate display performance of the backlight unit.

DISCLOSURE OF THE PRESENT INVENTION

The present invention was accomplished in view of the above circumstances. It is an object of the present invention to provide a technology that can prevent or suppress the uplift of the reflection sheet included in the direct type lighting device.

Means for Solving the Problem

A lighting device includes a light source board having a first main surface and a second main surface, a light source arranged on the first main surface of the light source board, a reflection sheet arranged on the first main surface of the light source board, and a housing member having a bottom surface arranged to face the second main surface of the light source board. The light source has a light emitting surface. The reflection sheet has a through hole through which the light source is passed. The housing member houses the light source board, the light source, and the reflection sheet. The reflection sheet is arranged such that a peripheral part of the through hole is located between the light emitting surface of the light source and the light source board.

According to the above lighting device, the peripheral part of the through hole may be located between the light emitting surface of the light source and the light source board, and thus the peripheral part of the through hole is held between the light emitting surface of the light source and the light source board.

With this configuration, the uplift of the reflection sheet can be prevented or suppressed.

The lighting device may further include a support member located between the light source and the light source board. The support member supports the light source. The peripheral part of the through hole is located beside the support member.

With this configuration, the support member is provided between the light source and the light source board, and thus, a space can be provided between the light source and the light source board. In the space, the peripheral part of the through hole is located beside the support member. The peripheral part of the through hole is located and held in the space, and thus the uplift of the reflection sheet can be prevented or suppressed.

The support member may be arranged at a position closer to a center of the light source than an edge of the light source.

With this configuration, the peripheral part of the through hole can be located further inside the space between the light source and the light source board. Thus, the peripheral part of the through hole is less likely to be moved away from the space between the light source and the light source board. Thus, the uplift of the reflection sheet can be effectively prevented or suppressed.

The reflection sheet may be arranged such that the peripheral part of the through hole is sandwiched between the light source and the light source board.

With this configuration, the peripheral part of the through hole is sandwiched in a vertical direction of the light source, and thus the uplift of the reflection sheet can be prevented or suppressed.

The light source may have a side surface and a cutout extending horizontally from a part of the side surface toward an inner side of the light source. The reflection sheet may be arranged such that the peripheral part of the through hole is located in the cutout of the light source.

With this configuration, the cutout is provided in apart of the side surface of the light source, and thus the space for housing the peripheral part of the through hole can be provided in the part of the side surface of the light source. Thus, the uplift of the reflection sheet can be prevented or suppressed.

The cutout may be formed at a lower side of the side surface of the light source.

In this configuration, the part of the reflection sheet is located in the cutout with a surface thereof being in contact with the front surface of the light source board. Thus, the part of the reflection sheet is less likely to be uplifted from the front surface of the light source board. Accordingly, the uplift of the reflection sheet can be prevented or suppressed.

The peripheral part of the through hole is sandwiched in the cutout in a height direction of the light source.

With this configuration, the peripheral part of the through hole is sandwiched in a vertical direction of the light source, and thus the uplift of the reflection sheet can be prevented or suppressed.

The technology disclosed herein may be embodied as a display device including a display panel configured to display by using light provided by the above lighting device. Further, a display device including a liquid crystal panel using liquid crystals as the display panel has novelty and utility. Furthermore, a television device including the above display device has novelty and utility. The above display device and television can have an increased display area.

Advantageous Effect of the Invention

The technology disclosed herein provides a technology that can prevent or suppress the uplift of the reflection sheet included in the direct type lighting device.

BRIEF DESCRIPTION OF THE DRAWINGS

FIG. 1 is an exploded perspective view illustrating a television device TV according to the first embodiment of the present invention;

MODE FOR CARRYING OUT THE INVENTION

First Embodiment

The first embodiment of the present invention will be described with reference to the drawings. An X-axis, a Y-axis, and a Z-axis are described in a part of the drawings. The axes in each drawing correspond to the respective axes in other drawings. The Y-axis direction and the X-axis direction, respectively, correspond to the vertical direction and the horizontal direction.

FIG. 1 illustrates a television device TV according to the first embodiment in an exploded perspective view. As illustrated in FIG. 1, the television device TV includes a liquid crystal display device 10, front and back cabinets Ca and Cb, a power supply P, a tuner T, and a stand S. The front and back cabinets Ca and Cb sandwich, and thus house, the liquid crystal display device 10. The liquid crystal display device 10 has a landscape quadrangular shape as a whole and held in the vertical position.

Figure 2:
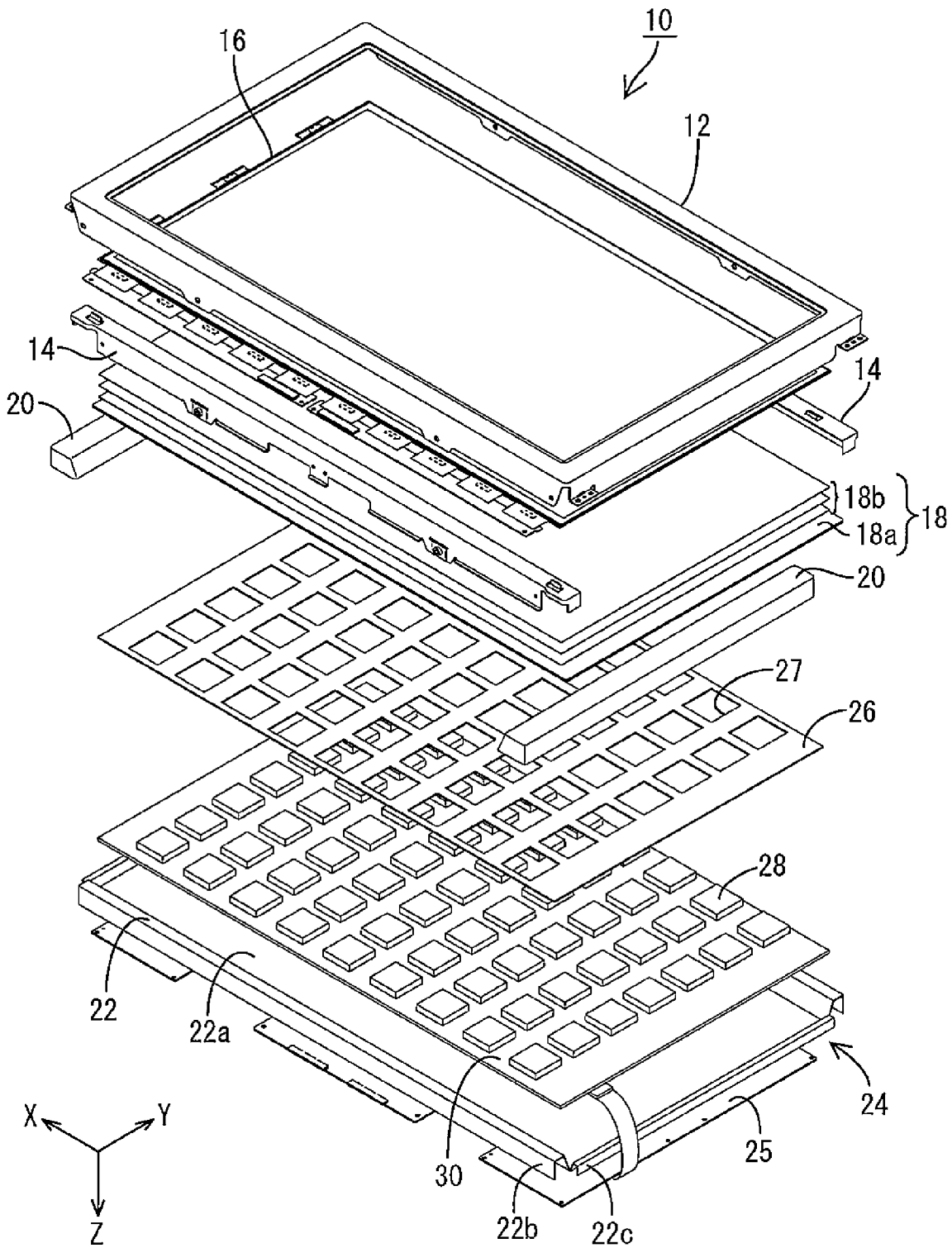
FIG. 2 is an exploded perspective view of a liquid crystal display device 10.
Figure 3:
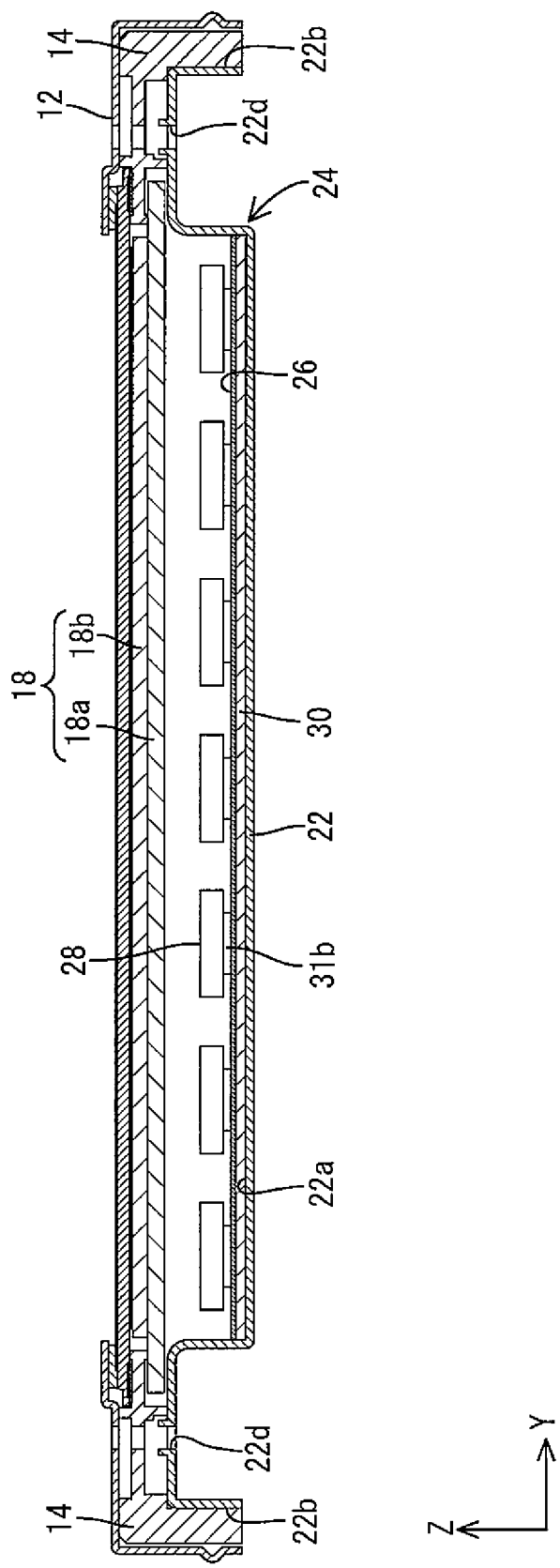
FIG. 3 is a cross-sectional view of the liquid crystal display device 10.

FIG. 2 illustrates the liquid crystal display device 10 in an exploded perspective view. FIG. 3 illustrates a vertical cross-sectional view of the liquid crystal display device 10. Herein, an upper side in FIG. 2 and FIG. 3 corresponds to a front side, and a lower side therein corresponds to a rear side. As illustrated in FIG. 2, the liquid crystal display device 10 includes a liquid crystal panel 16 as a display panel, and a backlight unit 24 as an external light source. The liquid crystal panel 16 and the backlight unit 24 are integrally held by a frame-shaped bezel 12 and the like.

Next, the liquid crystal panel 16 and the backlight unit 24 included in the liquid crystal display device 10 will be explained. The liquid crystal panel 16 is configured such that a pair of transparent (high light transmissive) glass substrates is bonded together with a predetermined gap therebetween and a liquid crystal layer (not illustrated) is sealed between the glass substrates. On one of the glass substrates, switching components (for example, TFTs) connected to source lines and gate lines which are perpendicular to each other, pixel electrodes connected to the switching components, an alignment film, and the like are provided. On the other glass substrate, color filters having color sections such as red (R), green (G), and blue (B) color sections arranged in a predetermined pattern, counter electrode, an alignment film, and the like are provided. Image data and control signals that are necessary to display an image are sent to the source lines, the gate lines, and the counter electrodes, from a drive circuit substrate, which is not illustrated. Polarizing plates (not illustrated) are arranged on outer surfaces of the glass substrates.

As illustrated in FIG. 2, the backlight unit 24 includes a backlight chassis 22, an optical member 18 (a diffuser plate 18a and a plurality of optical sheets 18b arranged on a front side of the diffuser plate 18a), and a frame 14. The backlight chassis 22 has a substantially box-like shape with an opening on the front side (a light exit side, the liquid crystal panel 16 side). The optical member 18 is provided on the front side of the backlight chassis 22 so as to cover the opening thereof. The frame 14 is arranged so as to extend along the long side of the backlight chassis 22 such that a long-side edge of the optical member is sandwiched between the frame 14 and the backlight chassis 22.

The backlight chassis 22 houses a plurality of LEDs (Light Emitting Diode) 28 as point light sources, an LED board 30 on which the LEDs 28 are arranged, and outer members 20. The outer members 20 are each arranged on short-side edge portions of the backlight chassis 22 and configured to direct the light emitted from the LEDs 28 toward an inner side. In the backlight unit 24, a light exit side is a side closer to the diffuser plate 28a than the LED board 30. The backlight unit 24 directly supplies the light to the liquid crystal panel 16 from the rear side of the liquid crystal panel 16 through the diffuser plate 18a.

The backlight chassis 22 is made of metal such as aluminum and formed in a shallow box-like shape by a sheet metal forming. The backlight chassis 22 includes a bottom plate 22a having a rectangular shape in a plan view, long-side edge portions 22b rising from each long side of the bottom plate 22a and bending back in a substantially U-shape, and short-side edge portions 22c rising from each short side of the bottom plate 22a and bending back in a substantially U-shape. As illustrated in FIG. 3, a fixing hole 22d is formed in each long-side edge portion 22b. This enables the bezel 12, the frame 14, and the backlight chassis 22 to be connected to each other.

On a front surface of the bottom plate 22a of the backlight chassis 22, the LED board 30 made of resin is arranged. On a front surface of the LED board 30, a reflection sheet 26 is arranged. In addition to the reflection sheet 26, LEDs 28 are aligned on the front side of the LED board 30. The reflection sheet 26 includes through holes 27 (see FIG. 4 and FIG. 5) through which the LEDs 28 are passed and exposed to the front side. On a rear surface of the bottom plate 22a of the backlight chassis 22, a power circuit board 25 is arranged. The power circuit board 25 supplies driving power to the LEDs 28.

The LEDs 28 are configured to emit white light. The LEDs 28 each may be configured by mounting a red LED chip, a green LED chip, and a blue LED chip (not illustrated) on its surface. Alternatively, the LED 28 may include a blue light emitting diode covered with a phosphor having a light emitting peak in a yellow range to emit white light. Alternatively, the LED 28 may include a blue light emitting diode covered with a phosphor having a light emitting peak in a green range and a phosphor having a light emitting peak in a red range to emit white light. Alternatively, the LED 28 may include a blue light emitting diode covered with a phosphor having a light emitting peak in a green range and a red light emitting diode to emit white light. Alternatively, the LED 28 may include a blue light emitting diode, a green light emitting diode, and a red light emitting diode to emit white light. Alternatively, the LED 28 may include an ultraviolet light emitting diode and phosphors. Particularly, the LED 28 may include an ultraviolet light emitting diode covered with a phosphor having a light emitting peak in a blue range, a phosphor having a light emitting peak in a green range, and a phosphor having a light emitting peak in a red range to emit white light.

The reflection sheet 26 is made of synthetic resin. A front surface of the reflection sheet 26 has a white color that provides high light reflectivity. The reflection sheet 26 is arranged on the bottom plate 22a of the backlight chassis 22 so as to cover almost entire inner surface thereof. With this arrangement, the light emitted from the LED 28 can be reflected toward the diffuser plate 18a.

The diffuser plate 18a included in the optical member 18 includes a synthetic resin plate and light scattering particles dispersed in the synthetic resin plate. The diffuser plate 18a is configured to diffuse point light emitted from the LEDs 28, which are point light sources, and reflect the light emitted from the LEDs 28. The optical sheet 18b arranged on the front side of the diffuser plate 18a includes a diffuser sheet, a lens sheet, and a reflection-type polarizing sheet in this sequence from the diffuser plate 18s side. The optical sheet 18b is configured to convert the light emitted from the LEDs 28 and passed through the diffuser plate 18a into a planar light. On the front side of the optical sheet 18, the liquid crystal panel 16 is arranged. The optical sheet 18b is sandwiched between the diffuser plate 18a and the liquid display panel 16.

Figure 4:
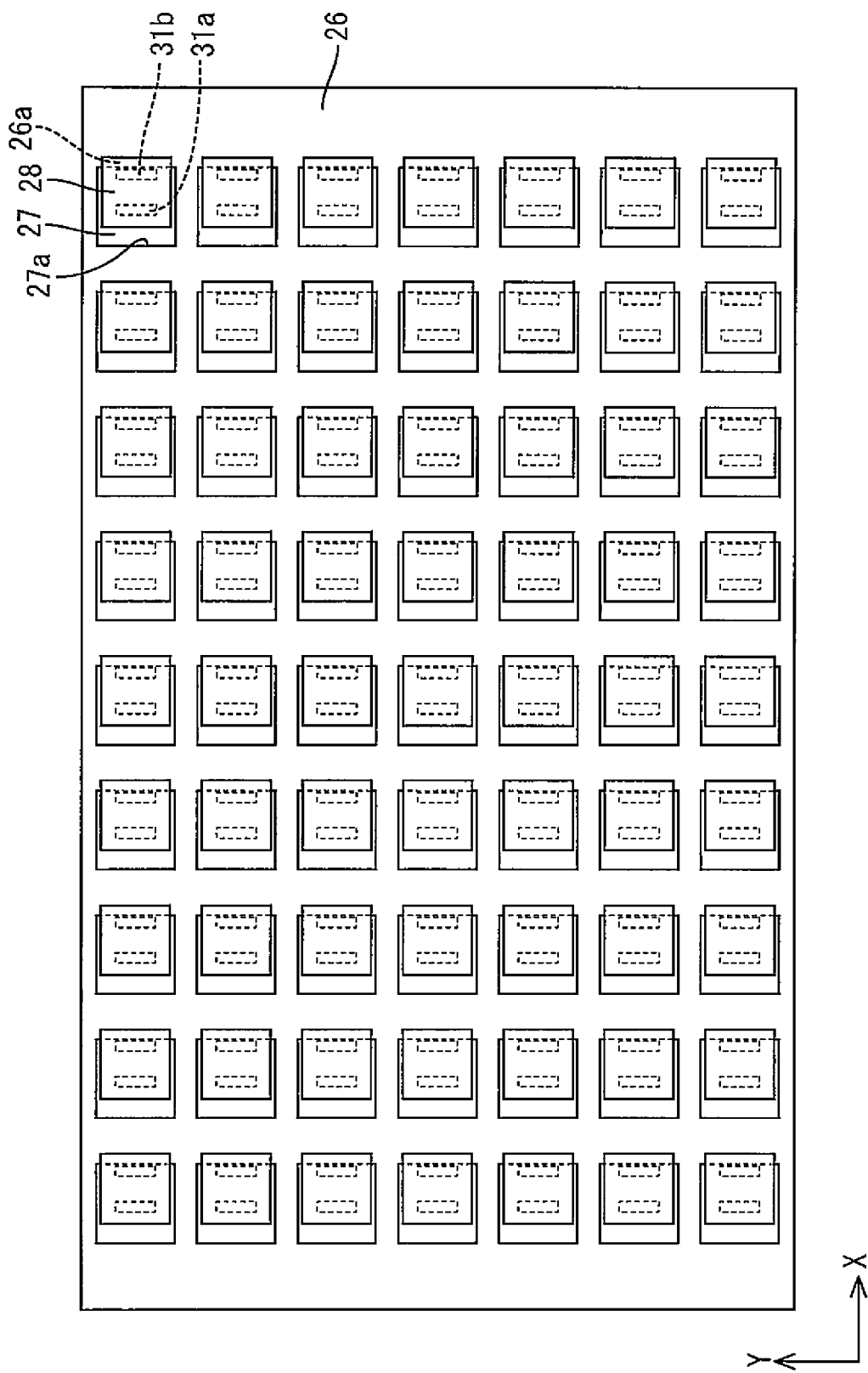
FIG. 4 is a plan view illustrating a reflection sheet 26 and an LED 28.
Figure 5:
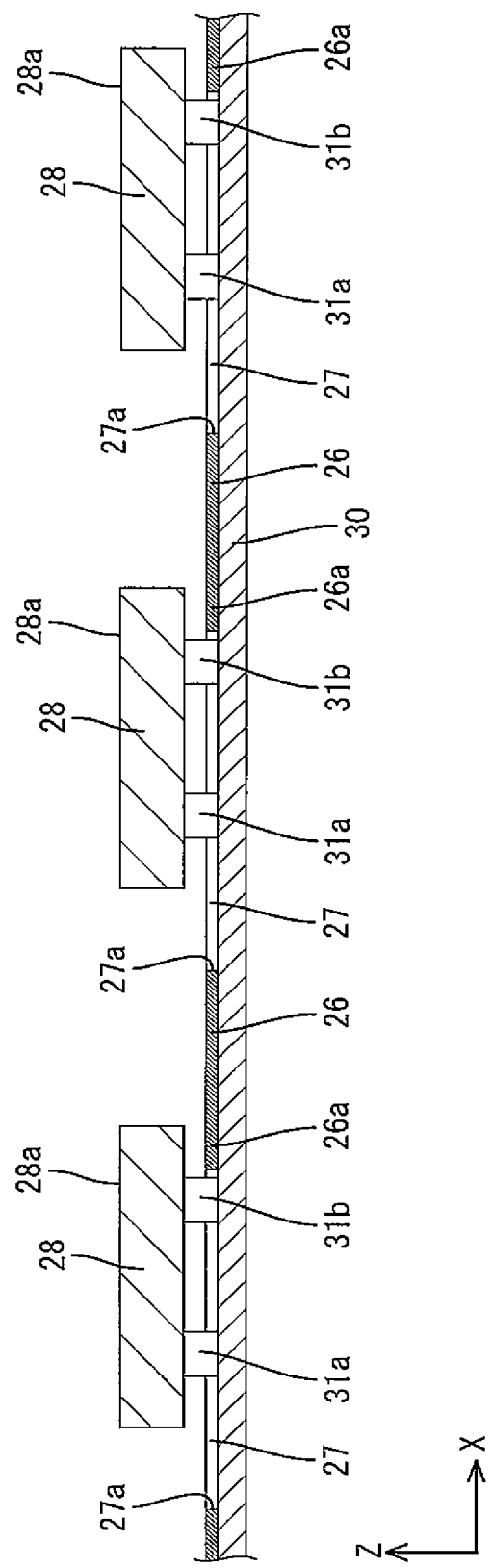
FIG. 5 is a cross-sectional view of the reflection sheet 26 and the LEDs 28 arranged on a front side of the LED board 30.

Next, the configuration of each LED 28 and the reflection sheet 26 will be explained. FIG. 4 is a plan view of the reflection sheet 26 and the LEDs 28 viewed from the front side. FIG. 5 is a magnified cross-sectional view of the reflection sheet 26 and the LEDs 28 arranged on the front side of the LED board 30. The reflection sheet 26 and the LEDs 28 are cut along a Y-Z plane passing through the center of each LED 28.

As illustrated in FIG. 4, each LED 28 has a rectangular shape in a plan view. A surface of the LED 28 is a light emitting surface 28a. On a rear surface of the LED 28, two legs 31a, 31b each having a plate shape are vertically provided at a position closer to the center of the LED 28 than the edge thereof. The legs 31a, 31b extend in the vertical direction (the Y-axis direction) with plate surfaces thereof arranged parallel to each other. The legs 31a, 31b are connected to the front surface of the LED board 30. The LED 28 is supported by the front surface of the LED board 30 via the legs 31a, 31b (FIG. 5). The legs 31a, 31b provide a space between the LED 28 and the LED board 30 on each side of the legs 31a, 31b.

The reflection sheet 26 includes through holes 27 at positions corresponding to the LEDs 28 in a state that the reflection sheet 26 is arranged on the front surface of the LED board 30. Each through hole 227 has a rectangular shape that is a little bit larger than the LED 28 such that the LED 28 can pass therethrough.

As illustrated in FIG. 4 and FIG. 5, a part 26a of a periphery 27a of each through hole 27 formed in the reflection sheet 26 (hereinafter, referred to as a part 26a of the reflection sheet 26), which is a part on one side of the rectangular shape of the through hole 27, is located beside the leg 31a, 31b between the light emitting surface 28a of the LED 28 and the LED board 30.

When the reflection sheet 26 is arranged on the front surface of the LED board 30, the reflection sheet is arranged on the LED board 30, on which the LEDs 28 and a lens 32 are mounted, such that the positions of the through holes 27 correspond to the positions of the lens members 32.

Then, the reflection sheet 26 in this state is moved downward (moved closer to the LED board 30). The LEDs 28 are passed through the through holes 27 to arrange the reflection sheet 26 on the front surface of the LED board 30. Subsequently, the reflection sheet 26 is slightly moved in a horizontal direction (the X-axis direction) such that the part 26a of the reflection sheet 26 is located between the LED 28 and the LED board 30. Thus, the part 26a of the reflection sheet 26 is held at a position between the LED 28 and the LED board 30, and thus the uplift of the reflection sheet 26 can be prevented or suppressed.

As described above, in the backlight unit 24 according to the present embodiment, the part 26a of the reflection sheet 26 is located between the light emitting surface 28a of the LED 28 and the LED board 30, and thus the part 26a of the reflection sheet 26 is held at the position between the light emitting surface 28a of the LED 28 and the LED board 30.

The backlight unit 24 according to the present embodiment further includes the legs 31a, 31b supporting the LED 28. The part of the reflection sheet 26 is located beside the leg 31a, 31b between the LED 28 and the LED board 30. With this configuration, a space can be provided beside the legs 31a, 31b between the LED 28 and the LED board 30. The part 26a of the reflection sheet 26 is located in this space and held therein, and thus the uplift of the reflection sheet 26 can be prevented or suppressed.

The backlight unit 24 of the present embodiment includes the legs 31a, 31b at the position closer to the center than the edge of the LED 28. Thus, the part 26a of the reflection sheet 26 can be located further inside the space between the LED 28 and the LED board 30. With this configuration, the part 26a of the reflection sheet 26 is less likely to be moved away from the space between the LED 28 and the LED board 30. Thus, the uplift of the reflection sheet 26 can be effectively prevented or suppressed.

Second Embodiment

Figure 6:
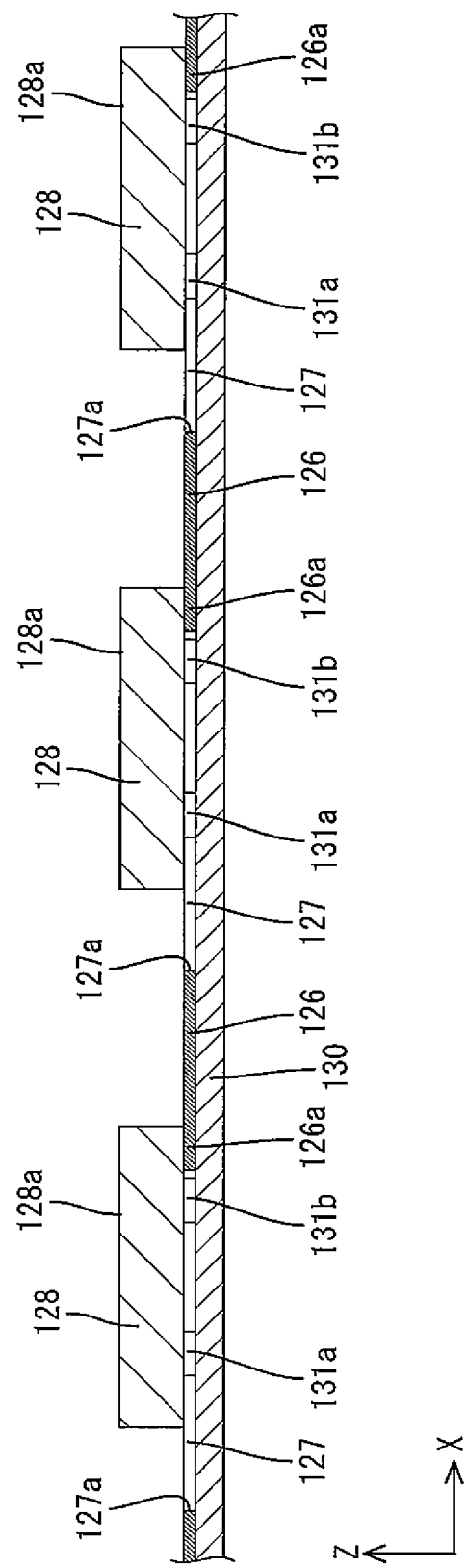
FIG. 6 is a cross-sectional view of a reflection sheet 126 and LEDs 128 arranged on a front side of an LED board 130 according to the second embodiment.

The second embodiment will be explained with reference to the drawings. FIG. 6 is a cross-sectional view of a reflection sheet 126 and LEDs 128 that are arranged on an LED board 130 according to the second embodiment. FIG. 6 corresponds to FIG. 5 of the first embodiment. In the second embodiment, a height of each leg 131a, 131b of the LED 128 is different from that of the legs 31a, 31b in the first embodiment. Configurations, functions, and effects similar to those of the first embodiment will not be explained. In FIG. 6, members and parts indicated by the number obtained by adding 100 to the reference numerals in FIG. 5 are the same as the members and the parts explained in the first embodiment.

In the backlight unit according to the second embodiment, each leg 131a, 131b of the LED 128 has a height substantially the same as the thickness of the reflection sheet 126. Thus, a front surface and a rear surface of a part 126a of the reflection sheet 126 located between the LED 128 and the LED board 130 is in contact with a rear surface of the LED 128 and a front surface of the LED board 130, respectively. With this configuration, the part 126a of the reflection sheet 126 is sandwiched in a height direction of the LED 128 (the Z-axis direction), and thus the uplift of the reflection sheet 126 can be further prevented or suppressed.

Third Embodiment

Figure 7:
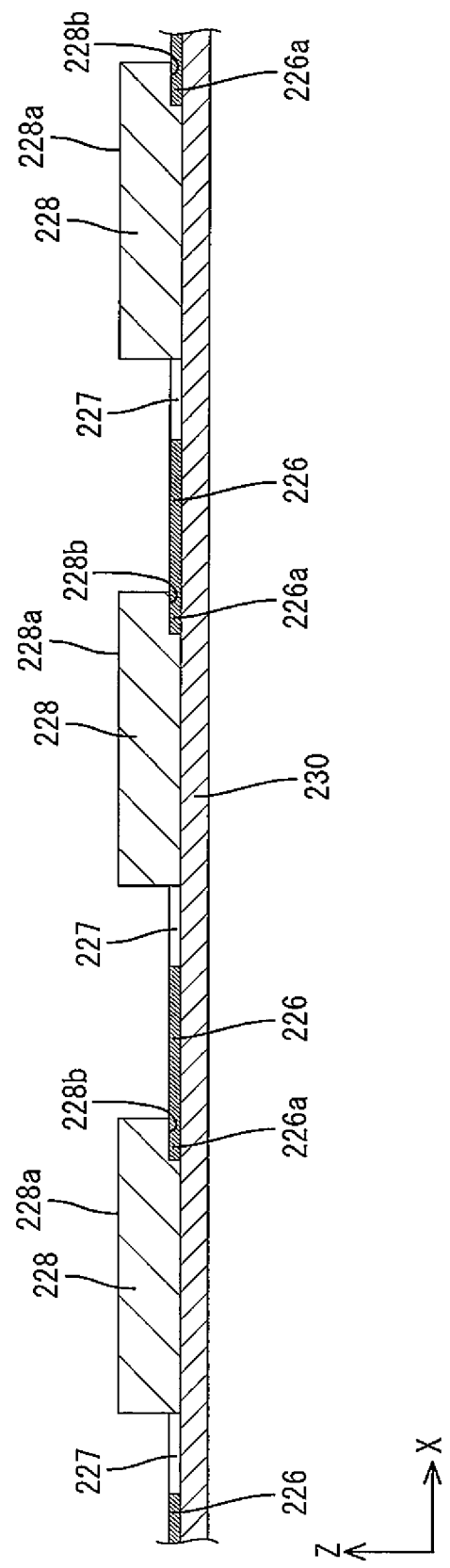
FIG. 7 is a cross-sectional view of a reflection sheet 226 and LEDs 228 arranged on a front side of an LED board 230 according to the third embodiment.

The third embodiment will be explained with reference to the drawings. FIG. 7 is a cross-sectional view of a reflection sheet 226 and LEDs 228 that are arranged on an LED board 230 according to the third embodiment. FIG. 7 corresponds to FIG. 5 of the first embodiment. In the second embodiment, unlike the first embodiment, no leg is provided on the LED 228, and a cutout 228b is formed in a side surface of the LED 228. Configurations, functions, and effects similar to those of the first embodiment will not be explained. In FIG. 7, members and parts indicated by the number obtained by adding 200 to the reference numerals in FIG. 5 are the same as the members and the parts explained in the first embodiment.

In the backlight unit according to the third embodiment, no leg is provided on the LED 228 and the LED 228 is directly mounted on a front surface of the LED board 230. Further, a cutout 228b extending in a horizontal direction (in a vertical direction of the backlight unit (the Y-axis direction) in the present embodiment) is formed in the side surface of the LED 228. The cutout 228b is formed in the side surface of the LED 228 at a side closer to the light source board 30. The width of the cutout 228b is substantially the same as the thickness of the reflection sheet 226. The cutout 228b provides a space between the light emitting surface of the LED 228 and the LED board 230. The part 226a of the reflection sheet 226 can be located in the space.

In the backlight unit according to the third embodiment, the LEDs 228 are passed through the through holes 227 of the reflection sheet 226 and the reflection sheet 226 is arranged on the front surface of the LED board 230. Then, the reflection sheet 226 is slightly moved such that the part 226a of the reflection sheet 226 is located in the cutout 228b formed in the side surface of the LED 228. In this state, a front surface and a rear surface of the part 226a of the reflection sheet 226 located in the cutout 228b is in contact with an upper surface of the cutout 228b and a front surface of the LED 228, respectively. With this configuration, the part 226a of the reflection sheet 226 is sandwiched in a height direction of the LED 228, and thus the uplift of the reflection sheet 226 can be prevented or suppressed.

In the backlight unit according to the third embodiment, the cutout 228b is provided at the lower side of the LED 228. Thus, the part of the reflection sheet 226 is located in the cutout 228b with the front surface thereof being in contact with the front surface of the LED board 228. With this configuration, the part of the reflection sheet 226 is less likely to be uplifted from the front surface of the LED board 228, and thus the uplift of the reflection sheet 226 can be prevented or suppressed.

Fourth Embodiment

Figure 8:
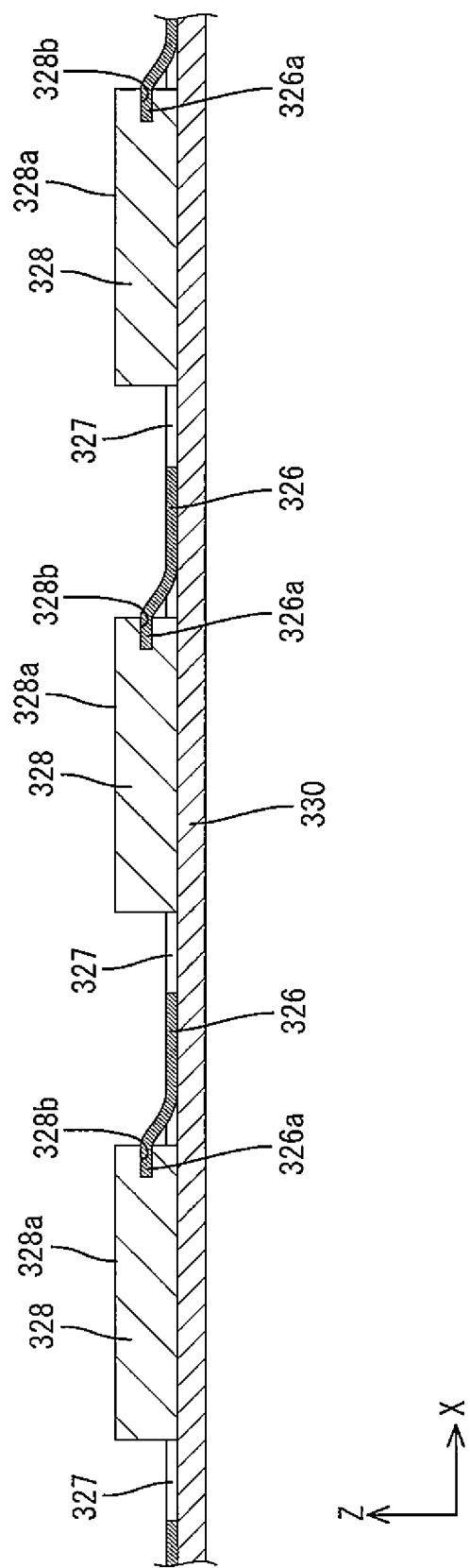
FIG. 8 is a cross-sectional view of a reflection sheet 326 and LEDs 328 arranged on a front side of an LED board 330 according to the third embodiment.

The fourth embodiment will be explained with reference to the drawings. FIG. 8 is a cross-sectional view of a reflection sheet 326 and LEDs 328 that are arranged on an LED board 330 according to the fourth embodiment. FIG. 8 corresponds to FIG. 7 of the third embodiment. In the fourth embodiment, the arrangement of a cutout 328b is different from the third embodiment. Configurations, functions, and effects similar to those of the first embodiment will not be explained. In FIG. 8, members and parts indicated by the number obtained by adding 100 to the reference numerals in FIG. 7 are the same as the members explained in the third embodiment.

In the backlight unit according to the fourth embodiment, a cutout 328b is formed in the side surface of the LED 328. The cutout 328b is formed on substantially the middle of the LED 328 in the height direction. The width of the cutout 328b is substantially the same as the thickness of the reflection sheet 326. After the reflection sheet 326 is arranged on the front surface of the LED board 330, the reflection sheet 326 is slightly moved such that the part 326a of the reflection sheet 326 is located in the cutout 328b formed in the side surface of the LED 328. In this state, the part 326a of the reflection sheet 326 located in the cutout 328b is positioned slightly above the LED board 330. Further, a front surface and a rear surface of the part 326a of the reflection sheet 326 located in the cutout 328b is in contact with an upper surface of the cutout 328b and a lower surface of the cutout 328b, respectively. With this configuration, the part 326a of the reflection sheet 326 is sandwiched in the height direction of the LED 328, and thus the uplift of the reflection sheet 326 can be prevented or suppressed.

The configuration of the embodiments correspond to the configuration of the present invention as follows: the LED board 30, 130, 230, 330 is one example of "light source board"; the LED 28, 128, 228, 328 is one example of "light source"; the backlight chassis 22 is one example of "housing member"; the backlight unit 24 is one example of "lighting device"; and the leg 31a, 31b, 131a, 131b is one example of "support member".

The above embodiments may include the following modifications.

(1) In the above embodiments, the part on the one side of the through hole is located between the light emitting surface of the LED and the LED board, but not limited thereto. Apart on two sides of the rectangular through hole may be located between the light emitting surface of the LED and the LED board. The larger an area of the part of the reflection sheet that is located between the light emitting surface of the LED and the LED board, the more properly the uplift of the reflection sheet can be prevented or suppressed.

(2) In the above embodiments, no spacer is provided on the front surface of the LED board. However, a spacer may be provided on the front surface of the LED board and passed through the through hole. The spacer maintains a distance between the LED board and the diffuser plate.

(3) In the above embodiments, the LED has a rectangular shape. However, the shape of the LED is not limited to the rectangular shape. The LED may have a circular shape.

(4) The arrangement, configuration, and number of the legs provided on the LED are not limited to those described in the above embodiments, and may be suitably changed.

(5) The arrangement of the cutout provided in the LED is not limited to those described in the above embodiments, and may be suitably changed.

(6) In the above embodiments, the liquid crystal display device including the liquid crystal panel as a display panel is used. The technology can be applied to display devices including other types of display panels.

(7) In the above embodiments, the television device including the tuner is used. However, the technology can be applied to a display device without a tuner.

The embodiments of the present invention are explained in detail above for illustrative propose only, and it is to be understood that the claims are not limited by the forgoing description. The technology described in the claims includes the various modifications of the embodiments described above.

The technology components described in the description and the drawings are not required to be used in the combination described in the claims as originally filed. The technology components can show its technical utility when used either alone or in combination. In addition, the technology described in the above description and the drawings can achieve more than one object at the same time, and the technical utility of the technology can be recognized when the technology achieves one of the objects.

EXPLANATION OF SYMBOLS

TV: television device, Ca, Cb: cabinet, T: tuner, S: stand, 10: liquid crystal display device, 12: bezel, 14: frame, 16: liquid crystal panel, 18: optical member, 18*a*: diffuser plate, 18*b*: diffuser sheet, 20: outer member, 22: backlight chassis, 22*a*: bottom plate, 22*b*: long-side edge, 22*c*: short-side edge, 22*d*: fixing hole, 24: backlight unit, 25: power circuit board, 26, 126, 226, 326: reflection sheet, 27, 127, 227, 327: through hole, 28, 128, 228, 328: LED, 28*a*, 128*a*, 228*a*, 328*a*: light emitting surface, 30, 130, 230, 330: LED board, 31*a*, 31*b*, 131*a*, 131*b*: leg, 228*b*, 328*b*: cutout

The invention claimed is:

1. A lighting device comprising:
   a light source board having a first main surface and a second main surface;
   a light source provided on the first main surface of the light source board, the light source including a light emitting surface;
   a reflection sheet provided on the first main surface of the light source board, the reflection sheet including a through hole through which the light source is passed; and
   a housing member including a bottom surface arranged to face the second main surface of the light source board in an axial direction, the housing member being configured to house each of the light source board, the light source, and the reflection sheet, wherein
   the reflection sheet is arranged such that the reflection sheet is overlapped in the axial direction with both the light emitting surface of the light source and the light board, the reflection sheet also being located between the light emitting surface of the light source and the light source board.

2. The lighting device according to claim 1, further comprising a support member located between the light source and the light source board, the support member supporting the light source, wherein
   a portion of the reflection sheet is located adjacent to the support member.

3. The lighting device according to claim 2, wherein
   the support member is located at a position closer to a center of the light source than an edge of the light source; and
   no portion of the support member is located between the edge of the light source and the light board.

4. The lighting device according to claim 2, wherein the portion of the reflection sheet is sandwiched between the light source and the light source board.

5. The lighting device according to claim 1, wherein
   the light source includes a side surface and a cutout extending horizontally from a portion of the side surface toward an inner side of the light source; and
   a portion of the reflection sheet is located in the cutout of the light source.

6. The lighting device according to claim 5, wherein the cutout is provided at a lower side of the side surface of the light source.

7. The lighting device according to claim 5, wherein the portion of the reflection sheet is sandwiched in the cutout in a height direction of the light source.

8. A display device comprising:
   a display panel configured to provide display using light from the lighting device according to claim 1.

9. The display device according to claim 8, wherein the display panel is a liquid crystal panel using liquid crystals.

10. A television device comprising the display device according to claim 8.

11. The lighting device according to claim 2, wherein the portion of the reflection sheet is a circumferential portion of the through hole.

12. The lighting device according to claim 4, wherein the portion of the reflection sheet is a circumferential portion of the through hole.

13. The lighting device according to claim 5, wherein the portion of the reflection sheet is a circumferential portion of the through hole.

14. The lighting device according to claim 7, wherein the portion of the reflection sheet is a circumferential portion of the through hole.

* * * * *